United States Patent [19]
Wen

[11] Patent Number: 5,824,585
[45] Date of Patent: Oct. 20, 1998

[54] SEMICONDUCTOR READ-ONLY MEMORY DEVICE AND METHOD OF FABRICATING THE SAME

[75] Inventor: Jemmy Wen, Hsinchu, Taiwan

[73] Assignee: United Microelectronics Corp, Hsinchu, Taiwan

[21] Appl. No.: 834,422

[22] Filed: Apr. 16, 1997

[30] Foreign Application Priority Data

Jan. 10, 1997 [TW] Taiwan .................................. 86100208

[51] Int. Cl.⁶ ............................................... H01L 21/8246
[52] U.S. Cl. ........................... 438/275; 438/130; 438/981
[58] Field of Search ..................................... 438/130, 275, 438/276, 277, 278, 981

[56] References Cited

U.S. PATENT DOCUMENTS

| | | | |
|---|---|---|---|
| 5,576,573 | 11/1996 | Su et al. | 438/275 |
| 5,597,753 | 1/1997 | Sheu et al. | 438/275 |
| 5,712,203 | 1/1998 | Hsu | 438/981 |

*Primary Examiner*—Chandra Chaudhari
*Attorney, Agent, or Firm*—Finnegan, Henderson, Farabow, Garrett & Dunner, L.L.P.

[57] ABSTRACT

A semiconductor read-only memory (ROM) device is provided. The particular semiconductor structure of this ROM device can reduce the parasitic capacitance between the bit lines and the word lines, such that the resistance-capacitance time constant of the memory cells can be reduced to thereby speed up the access time to the memory cells. The binary data stored in each memory cell is dependent on whether a contact window is predefined to be formed in a thick insulating layer between the buried bit lines and the overlaying word lines. If the gate electrode of one memory cell is electrically connected to the associated word line via one contact window through the insulating layer, that memory cell is set to a permanently-ON state representing a first binary value; otherwise, that memory cell is set to a permanently-OFF state representing a second binary value. The threshold voltage of the permanently-ON memory cells is about in the range from 0.4 V to 0.7 V.

5 Claims, 6 Drawing Sheets

SEMICONDUCTOR READ-ONLY MEMORY DEVICE AND METHOD OF FABRICATING THE SAME

BACKGROUND OF THE INVENTION

1. Field of the Invention

This invention relates to semiconductor memory devices, and more particularly, to a ROM (read-only memory) device of the type consisting of a plurality of MOS (metal-oxide semiconductor) transistor memory cells and a method for fabricating the same. It is a distinctive feature of this invention that a thick insulating layer is used to separate the bit lines from the word lines of the ROM device such that the parasitic capacitance therebetween the same can be reduced.

2. Description of Related Art

Read-only memory (ROM) is a nonvolatile semiconductor memory widely used in computer and microprocessor systems for permanently storing information including programs and data that are repeatedly used, such as the BIOS (abbreviation for Basic Input/Output System, a widely used operating system on personal computers) or the like. The manufacture of ROMs involves very complicated and time-consuming processes and requires costly equipment and material to achieve. Therefore, the information to be stored in ROMs is usually first defined by the customer and then furnished to the factory to be programmed into the ROMs.

The feature size of ROMs is dependent on the semiconductor fabrication technology. Conventional ROMs are composed of by an array of MOSFETs (metal-oxide semiconductor field-effect transistors), each MOSFET being associated with one single memory cell of the ROM device. The binary state of each MOSFET is dependent on a particular electrical characteristic of the MOSFET, for example the threshold voltage of the MOSFET. If the channel of a MOSFET is doped with high-concentration impurities, the threshold voltage of this MOSFET will be reduced to a low level that is less than the gate voltage, thus setting the MOSFET to a permanently-ON state representing a first binary value, for example 0. On the other hand, if the MOSFET is not doped with impurities, the threshold voltage will remain at a highlevel that is greater than the gate voltage, thus setting the MOSFET to a permanently-OFF state representing another binary value, for example 1. This conventional method for assigning binary data to the memory cells of a ROM device will be described in more detail in the following paragraphs with reference to FIGS. 1 through 3.

Referring to FIG. 1, there is shown a schematic top view of a conventional ROM device. This ROM device is formed with a plurality of substantially parallel-spaced diffusion regions which serve as a plurality of buried bit lines 12a, 12b, 12c beneath a plurality of field oxide layers 200. Further, a plurality of word lines (WL1, WL2) 18, 18' are formed in such a manner as to intercross the bit lines 12a, 12b, 12c at right angles. The intersections between the bit lines 12a, 12b, 12c and the word lines WL1, WL2 are the locations where the memory cells of the ROM device are formed. For instance, a first memory cell 16a is formed on the word line WL2 between the bit lines 12a, 12b; a second memory cell 16b is formed on the word line WL2 between the bit lines 12b, 12c; a third memory cell 16c is formed on the word line WL1 between the bit lines 12a, 12b; and a fourth memory cell 16d is formed on the word line WL1 between the bit lines 12b, 12c. The binary data that are permanently stored in these memory cells 16a, 16b, 16c, 16d are dependent on the concentration of the associated diffusion regions. For instance, the $N^+$ regions in FIG. 1 represent that the associated memory cells 16a, 16d are set to a permanently-ON state; and on the other hand, the memory cells 16b, 16c are set to an permanently-OFF state.

FIG. 2 is a perspective view of a cutaway part of the ROM device of FIG. 1, with the front side thereof showing a cross section cutting through the line II—II in FIG. 1. This perspective diagrams shows that the ROM device includes a P-type silicon substrate 10 on which the bit lines 12a, 12b, 12c and the overlaying field oxide layers 200 are formed. Beside these, the ROM device includes a thin insulating layer 14 on which the word lines (WL1, WL2) 18, 18' are formed.

FIG. 3 is an equivalent circuit diagram of the ROM device of FIG. 1. This circuit diagram shows that the two word lines WL1 and WL2 are used to access the binary data stored in the four memory cells 16a, 16b, 16c, 16d via the three bit lines (BL1, BL2, BL3) 12a, 12b, 12c. In this example, the first memory cell 16a is set to a permanently-ON state; the second memory cell 16b is set to a permanently-OFF state; the third memory cell 16c is set to a permanently-OFF state; and the fourth memory cell 16d is set to a permanently-ON state.

One drawback to the foregoing ROM device, however, is that, since the bit lines (BL1, BL2, BL3) 16a, 16b, 16c and the word lines (WL1, WL2) 18, 18' are only separated by the thin insulating layer 14, a parasitic capacitance could arise therebetween. The existence of the parasitic capacitance will increase the resistance-capacitance time constant of the memory cells, thus causing a delay in the access time to the memory cells.

SUMMARY OF THE INVENTION

It is therefore a primary objective of the present invention to provide a new semiconductor structure for a ROM device which can reduce the parasitic capacitance between the bit lines and the word lines for fasten access time of the ROM device.

It is another objective of the present invention to provide a method for fabricating the foregoing ROM device.

In accordance with the foregoing and other objectives of the present invention, a new semiconductor structure for ROM device and a method for fabricating the same are provided.

The semiconductor structure of this new ROM device is based a semiconductor substrate of a first type, for example P-type. A plurality of substantially parallel-spaced diffusion regions of a second type are formed in the substrate to serve as a plurality of buried bit lines for the ROM device. Each neighboring pair of these bit lines is associated with one memory cell of the ROM device. A thick insulating layer is formed over the substrate, which is predefined to form a contact window associated with one pair of the plurality of bit lines associated with one memory cell of the ROM device that is to be set to a permanently-ON state. A gate dielectric layer is formed in the contact window on the substrate. The gate dielectric layer is thinner than the insulating layer. Further, a plurality of substantially parallel-spaced conductive layers are formed over the insulating layer to serve as a plurality of word lines. These word lines are formed in such a manner as to intercross the bit lines. Each of the memory cells being located on one word line between one neighboring pair of the bit lines.

In the ROM device, each one of the plurality of memory cells is set to a permanently-ON state provided that the associated pair of bit lines are connected via the contact window to one word line. On the other hand, each one of the plurality of memory cells is set to a permanently-OFF state provided that the associated pair of bit lines are not connected via the contact window to one word line.

Further, the method in accordance with the invention for fabricating the foregoing ROM device includes the following steps:

(1) preparing a semiconductor substrate of a first type;

(2) performing a photolithographic and etching process so as to form a photoresist layer over the substrate, the photoresist layer having a plurality of openings to expose the surface areas of the substrate where a plurality of bit lines are to be formed;

(3) by using the photoresist layer as a mask, conducting an ion implantation process so as to diffuse an impurity material of a second type into the exposed areas of the substrate to form a plurality of diffusion regions serving as the bit lines for the ROM device;

(4) removing the photoresist layer;

(5) forming an insulating layer formed over the substrate, the insulating layer being predefined to form a contact window associated with one memory cell of the ROM device that is to be set to a permanently-ON state;

(6) forming a gate dielectric layer in the contact window on the substrate, the gate dielectric layer being less in thickness than the insulating layer; and (7) forming a plurality of substantially parallel-spaced conductive layers serving as a plurality of word lines over the insulating layer, the word lines being formed in such a manner as to intercross the bit lines, each of the memory cells being located on one word line between one neighboring pair of the bit lines.

It is a distinctive feature of the ROM device of the invention that a thick insulating layer is formed to separate the bit lines and the word lines. The ON-OFF state of each memory cell is dependent on whether a contact window is formed through the overlaying thick insulating layer to electrically connect the associated gate electrode of that memory cell to one word line. The provision of the thick insulating layer can reduce the parasitic capacitance between the bit lines and the word lines. As a result of this, the resistance-capacitance time constant of the memory cells can be reduced, thereby allowing a fasten access time of the ROM device for high-speed data read operation.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENT

FIGS. 4A through 4D are schematic sectional diagrams depicting the steps involved in the method according to the present invention for fabricating a ROM device.

Figure 1:
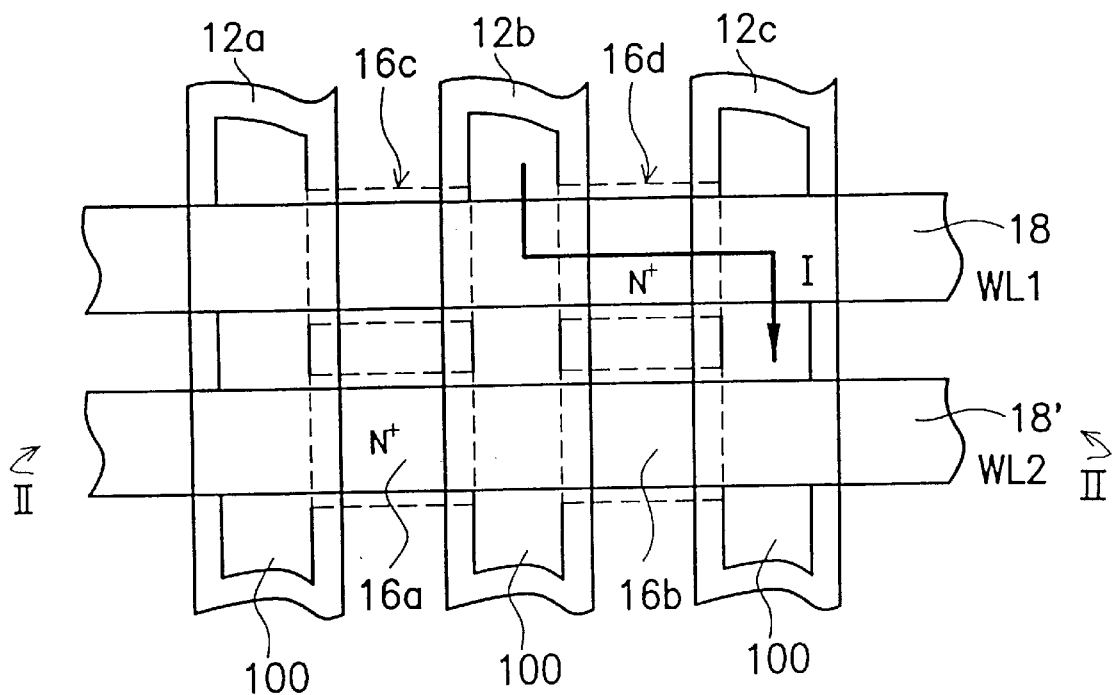
FIG. 1 is a schematic top view of a conventional ROM device.
Figure 2:
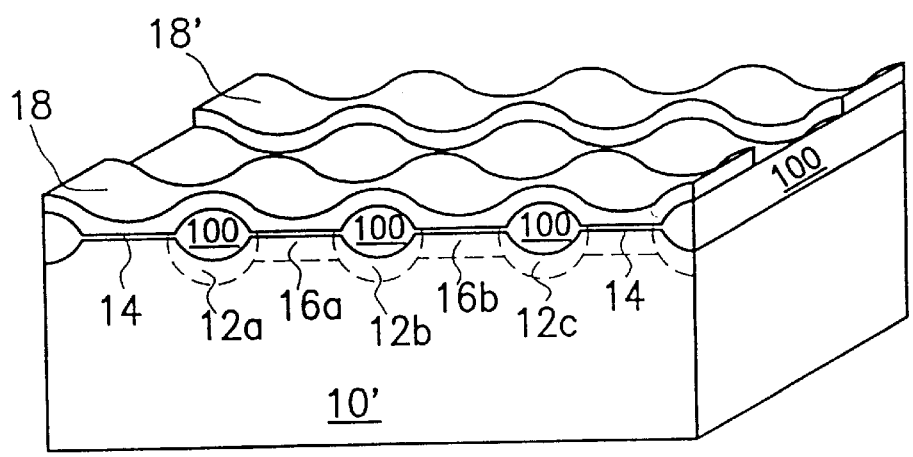
FIG. 2 is a schematic perspective view of a cutaway part of the ROM device of FIG. 1 cutting through the line II—II in FIG. 1.
Figure 3:
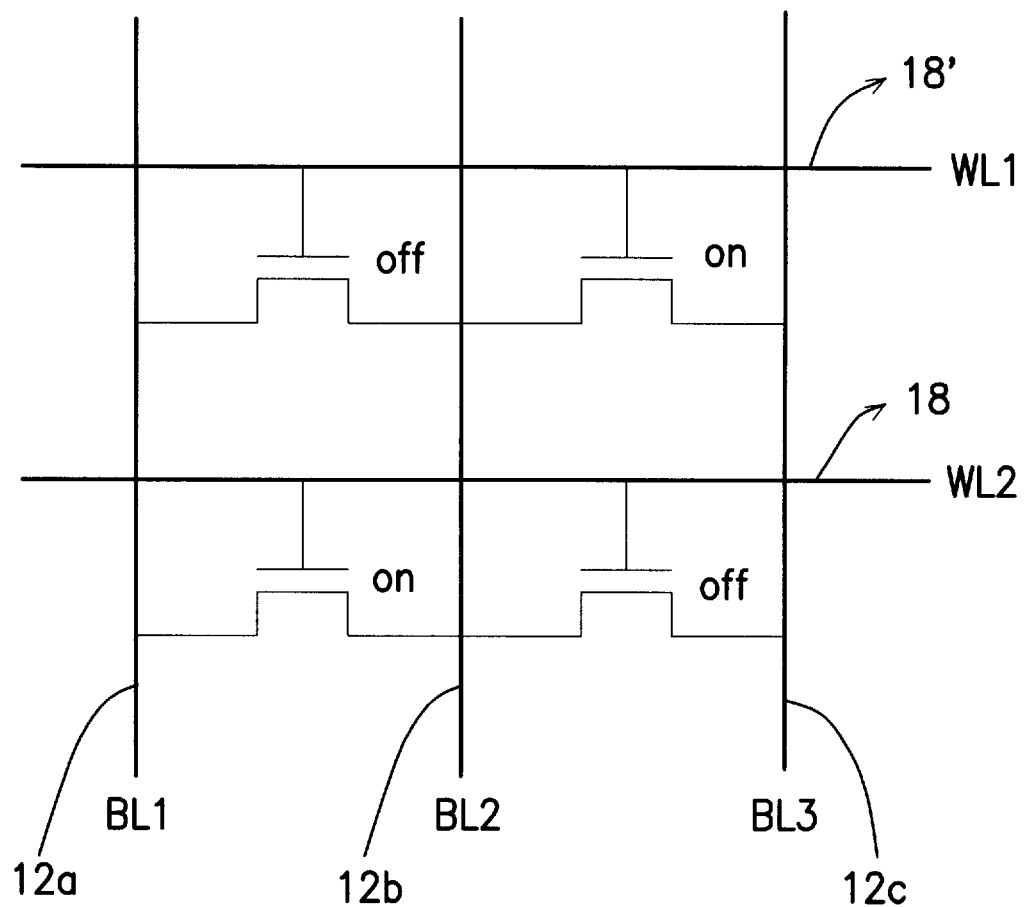
FIG. 3 is an equivalent circuit diagram of the ROM device of FIG. 1.
Figure 4A:
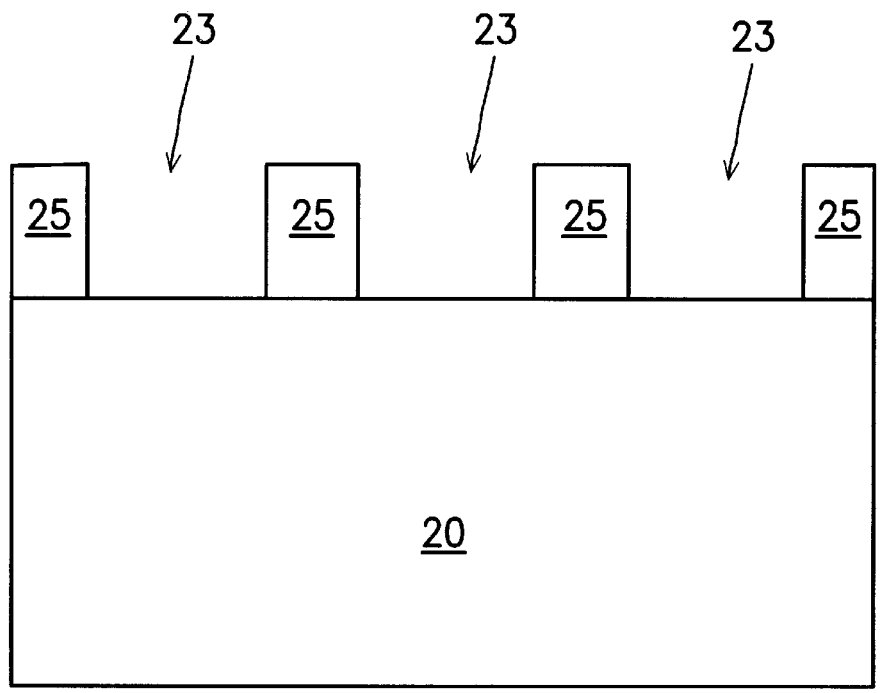
FIGS. 4A through 4D are schematic sectional diagrams used to depict the steps involved in the method according to the present invention for fabricating the ROM device of the invention.

Referring first to FIG. 4A, in the first step, a semiconductor substrate, such as a P-type silicon substrate 20, is prepared. Over the P-type silicon substrate 20, a photoresist layer 25 having a plurality of openings 23 is formed. The openings 23 of the photoresist layer 21 are predefined in such a manner as to expose those areas on the wafer where a plurality of buried bit lines of the ROM device are to be formed. Subsequently, by using the photoresist layer 25 as a mask, an ion implantation process is performed on the wafer so as to diffuse an N-type impurity material, such as arsenic or phosphorus ions, through the openings 23 in the photoresist layer 21 into the exposed regions of the P-type silicon substrate 20.

Alternatively, the P-type silicon substrate 20 can be instead an N-type silicon substrate. If this is the case, a P-type impurity material should be used instead for the ion implantation process.

Figure 4B:
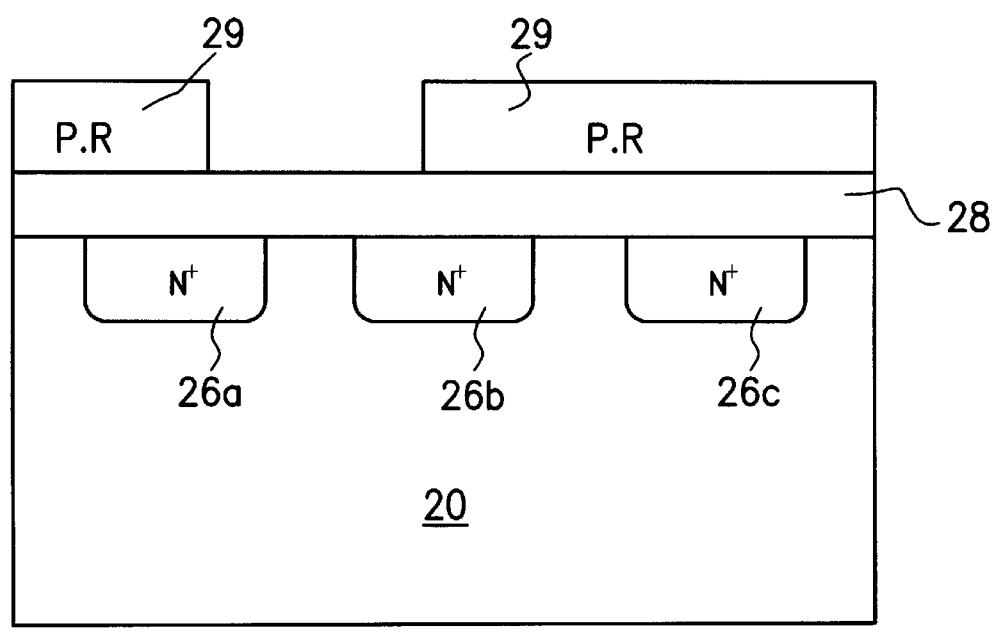

Referring further to FIG. 4B, through the ion implantation process, a plurality of substantially parallel-spaced $N^+$ diffusion regions 26a, 26b, and 26c are formed, which serve as a plurality of buried bit lines BL1, BL2, BL3 for the ROM device.

Subsequently, a thick insulating layer, such as a layer of silicon dioxide 28, is formed over the entire top surface of the P-type silicon substrate 20, which is used to separate the $N^+$ diffusion regions (bit lines BL1, BL2, BL3) 26a, 26b, 26c from the word lines that are to be formed later over the wafer. A conventional photolithographic and etching process is then performed on the wafer so as to form a photoresist layer 29 over the silicon dioxide layer 28. The photoresist layer 29 is selectively removed to form an opening which exposes one surface area of the silicon dioxide layer 28 where a gate dielectric layer associated with the two $N^+$ diffusion regions (bit lines BL1, BL2) 26a, 26b is to be formed.

Figure 4C:
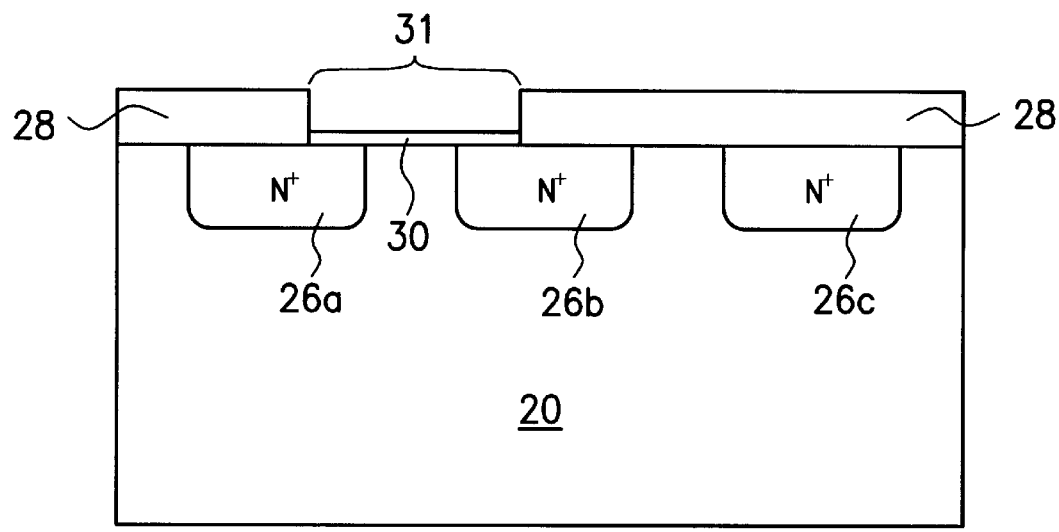

Referring next to FIG. 4C, by using the photoresist layer 29 as a mask, an etching process is performed on the wafer, so as to etch away the uncovered part of the silicon dioxide layer 28 until the top surface of the P-type silicon substrate 20 is exposed. This forms a contact window 31 through the silicon dioxide layer 28. After this, the photoresist layer 29 is removed. A thin gate dielectric layer 30 is then deposited through the contact window 31 onto the exposed surface of the P-type silicon substrate 20 that is uncovered by the silicon dioxide layer 28. This gate dielectric layer 30 is much thinner than the silicon dioxide layer 28.

Figure 4D:
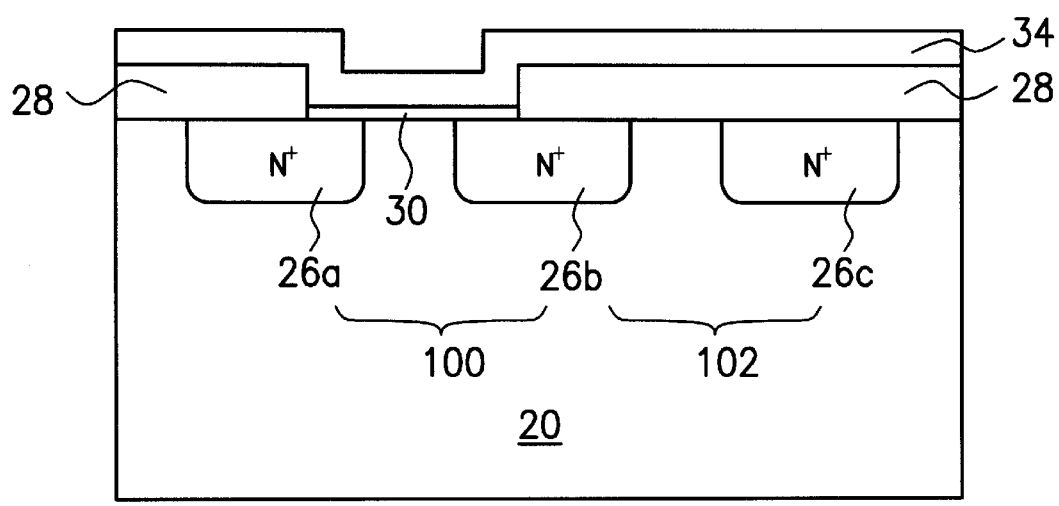

Referring to further FIG. 4D, a plurality of substantially parallel-spaced conductive layers of a conductive material selected from polysilicon, aluminum, tungsten, and titanium are formed over the surface of the silicon dioxide layer 28 and gate dielectric layer 30 to serve as a plurality of word lines WL1, WL2 (only the one as designated by the reference numeral 34 is viewable in this sectional diagram). These conductive layers (word lines) 34 are formed in such a manner as to intercross the $N^+$ diffusion regions 26a, 26b, and 26c. The two $N^+$ diffusion regions 26a, 26b and the overlaying conductive layer (word line) 34 in combination form one MOS-transistor memory cell for the ROM device which is set to a permanently-ON state, as collectively designated by the reference numeral 100. In this MOS-transistor memory cell 100, the two N⁺ diffusion regions 26a, 26b serve as a pair of source/drain regions for the MOS-transistor memory cell and the overlaying conductive layer (word line) 34 serves as a gate. The threshold voltage of this MOS-transistor memory cell 100 is about in the range from 0.4 V to 0.7 V.

On the other hand, the two N⁺ diffusion regions 26b, 26c in combination form another MOS-transistor memory cell for the ROM device which is set to a permanently-OFF state, as collectively designated by the reference numeral 102.

Figure 5:
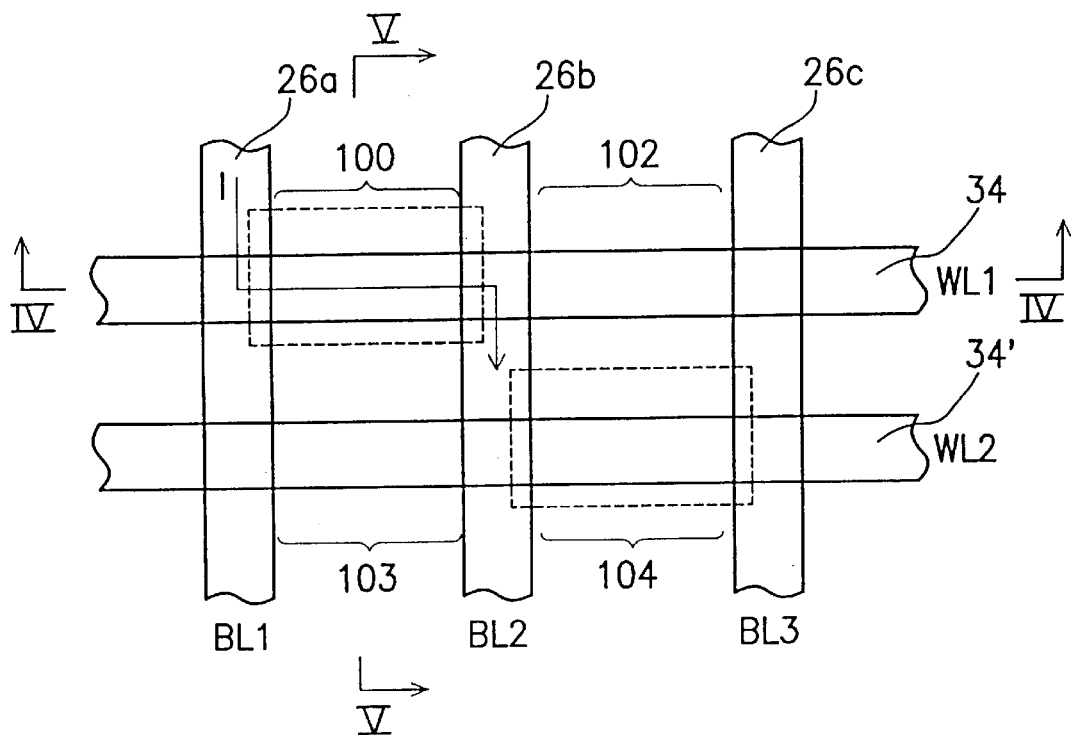
FIG. 5 is a schematic top view of the finished product of the ROM device shown in FIG.4D.

Referring to FIG. 5, there is shown a schematic top view of the finished product of the ROM device of FIG. 4D. In FIG. 5, the cross-sectional view cutting through the line IV—IV' is the diagram shown in FIG. 4D. The intersections between the bit lines BL1, BL2, BL3 (the N⁺ diffusion regions 26a, 26b, and 26c) and the word lines WL1, WL2 (the conductive layers 34, 34') are the locations where the memory cells of the ROM device are formed. For instance, a first memory cell 100 is formed on the word line WL1 between the bit lines BL1, BL2; a second memory cell 102 is formed on the word line WL1 between the bit lines BL2, BL3; a third memory cell 103 is formed on the word line WL2 between the bit lines BL1, BL2; and a fourth memory cell 104 is formed on the word line WL2 between the bit lines BL2, BL3. Among these memory cells 100, 102, 103, 104, for example, the first memory cell 100 is set to a permanently-ON state; the second memory cell 102 is set to a permanently-OFF state; the first memory cell 103 is set to a permanently-OFF state; and the fourth memory cell 104 is set to a permanently-ON state. As described in the foregoing, whether one memory cell is set to a permanently-ON or a permanently-OFF state is dependent on whether a contact window 31 (FIG. 4C) is formed in the silicon dioxide layer 28 so as to connect the associated memory cell to the overlaying conductive layers (word lines) 34. That is to say, the provision of a contact window to one memory cell sets that memory cell to a permanently-ON state; otherwise, the memory cell is set to a permanently-OFF state.

Figure 6:
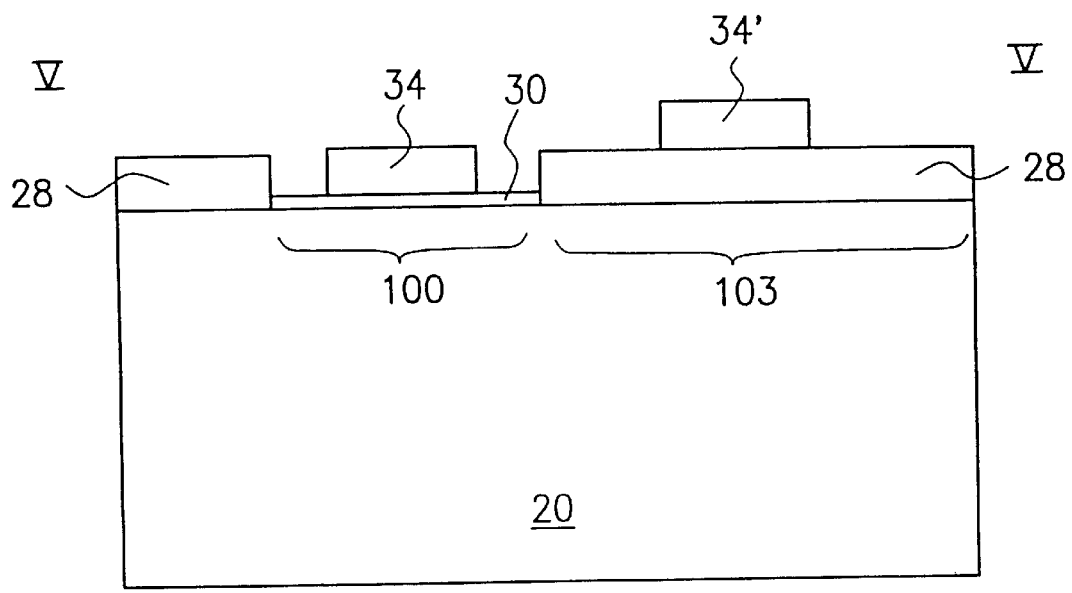
FIG. 6 is a schematic sectional diagram of the ROM device of FIG. 5 cutting through the line V—V.

Further, FIG. 6 shows a cross-sectional view of the ROM device of FIG. 5 cutting through the line V—V. This diagram shows the two memory cells 100 and 103. The memory cell 100 is set to a permanently-ON state because it is connected via the thin gate dielectric layer 30 to the overlaying conductive layer (word line) 34, while the memory cell 103 is set to a permanently-OFF state because it is separated by the thick silicon dioxide layer 28 from the overlaying conductive layer (word line) 34'.

Figure 7:
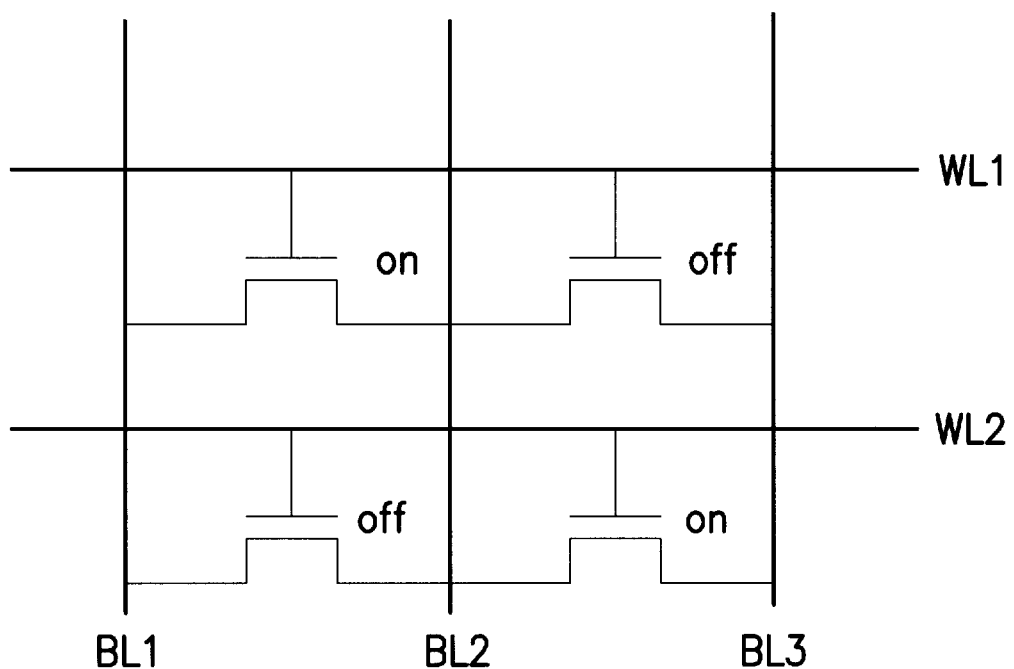
FIG. 7 is an equivalent circuit diagram of the ROM device of FIG. 5.

FIG. 7 is an equivalent circuit diagram of the ROM device of FIG. 5. This circuit diagram shows that the two word lines WL1 and WL2 are used to access the binary data stored in the four memory cells 100, 102, 103, 104 via the three bit lines BL1, BL2, BL3. In the example shown, the first memory cell 100 is set to a permanently-ON state; the second memory cell 102 is set to a permanently-OFF state; the third memory cell 103 is set to a permanently-OFF state; and the fourth memory cell 104 is set to a permanently-ON state.

The threshold voltage of the above-disclosed ROM device of the invention is about 0.7 V. It is a distinctive feature of the ROM device of the invention that the provision of a thick insulating layer 28 to separate the bit lines and the word lines allows for the prevention of the parasitic capacitance in the ROM device. Therefore, the resistance-capacitance time constant of the memory cells can be reduced, resulting in a fast access time to the memory cells.

The invention has been described using exemplary preferred embodiments. However, it is to be understood that the scope of the invention is not limited to the disclosed embodiments. To the contrary, it is intended to cover various modifications and similar arrangements. The scope of the claims, therefore, should be accorded the broadest interpretation so as to encompass all such modifications and similar arrangements.

What is claimed is:

1. A method for fabricating a ROM device having a plurality of MOS-transistor memory cells, comprising the steps of:

(1) preparing a semiconductor substrate of a first type;

(2) performing a photolithographic and etching process so as to form a photoresist layer over the substrate, the photoresist layer having a plurality of openings to expose the surface areas of the substrate where a plurality of bit lines are to be formed;

(3) by using the photoresist layer as a mask, conducting an ion implantation process so as to diffuse an impurity material of a second type into the exposed areas of the substrate to form a plurality of diffusion regions serving as the bit lines for the ROM device;

(4) removing the photoresist layer;

(5) forming an insulating layer formed over the substrate, the insulating layer being predefined to form a contact window associated with one memory cell of the ROM device that is to be set to a permanently-ON state;

(6) forming a gate dielectric layer in the contact window on the substrate, the gate dielectric layer being thinner than the insulating layer; and (7) forming a plurality of substantially parallel-spaced conductive layers serving as a plurality of word lines over the insulating layer, the word lines being formed in such a manner as to intercross the bit lines, wherein each of the memory cells being located on one word line between one neighboring pair of the bit lines.

2. The method of claim 1, wherein the first type is P-type while the second type is N-type.

3. The method of claim 1, wherein the first type is N-type while the second type is P-type.

4. The method of claim 1, wherein each one of the plurality of memory cells is set to a permanently-ON state provided that the associated pair of bit lines are connected via one contact window to one word line.

5. The method of claim 1, wherein each one of the plurality of memory cells is set to a permanently-OFF state provided that the associated pair of bit lines are not connected via one contact window to one word line.

* * * * *